United States Patent

[11] 3,523,495

[72] Inventors Gary R. Giedd
Wappingers Falls, New York;
Merlyn H. Perkins, Hopewell Junction,
New York
[21] Appl. No. 713,521
[22] Filed March 15, 1968
[45] Patented Aug. 11, 1970
[73] Assignee International Business Machines
Corporation
Armonk, New York
a Corp. of New York

[54] APPARATUS FOR FORMING CIRCUIT MASKS ON PHOTOSENSITIZED SCREENS AND INSPECTING THE SAME AND/OR INSPECTING SUBSTRATES HAVING CONDUCTIVE CIRCUIT PATTERNS
4 Claims, 10 Drawing Figs.

[52] U.S. Cl. 95/12, 355/40, 355/99
[51] Int. Cl. G03b 29/00
[50] Field of Search 355/40, 44, 45, 53, 86, 95, 99; 95/12

[56] References Cited
UNITED STATES PATENTS

| | | | |
|---|---|---|---|
| 3,247,761 | 4/1966 | Herreman et al | 95/12 |
| 3,323,414 | 6/1967 | Ritchie et al | 95/12 |

*Primary Examiner*— Norton Ansher
*Assistant Examiner*— Michael D. Harris
*Attorney*—Hanifin and Jancin ABSTRACT: A printed circuit exposure and inspection tool automatically generates a printed circuit mask by direct optical exposure of a photosensitized wire mesh mask screen in response to information stored in a computer as calculated circuit data. The mask may then be used in a silk screen printing operation which deposits a conductive printed circuit pattern on individual layers of a ceramic substrate followed by stacking and bonding of the individual layers to form a multilayer module. The printed circuit exposure and inspection tool automatically inspects the latent and developed printed circuit patterns on the screen mask, and also inspects the conductive printed circuit pattern deposited on the ceramic substrates so as to electrically generate actual circuit data. The actual circuit data and calculated circuit data are compared in the computer so as to automatically reject erroneously formed patterns.

INVENTORS

GARY R. GIEDD

MERLYN H. PERKINS

BY Kenneth R. Stevens

ATTORNEY

PUNCH UNIT

APPARATUS FOR FORMING CIRCUIT MASKS ON PHOTOSENSITIZED SCREENS AND INSPECTING THE SAME AND/OR INSPECTING SUBSTRATES HAVING CONDUCTIVE CIRCUIT PATTERNS

BACKGROUND OF THE INVENTION

This invention relates to apparatus for automatically making a semiconductor module, and more particularly to apparatus which automatically generates a printed circuit mask.

Multi-laminated ceramic modules have been used to mount and interconnect a plurality of integrated circuit chips. By way of example, a multi-layer ceramic module may comprise various voltage and wiring planes, and also a translational plane. Additionally, dummy layers may be utilized in the module so as to maintain a constant packing thickness. Generally, it is known that each individual layer may have deposited thereon a conductive printed circuit pattern by employing a photoresist mask and silk screening print process. Although printing processes other than the silk screening method may be employed, it is generally necessary to first fabricate a printed circuit mask.

More specifically in the past, masks have been fabricated by what is essentially a photographic technique. This requires the generation of artwork which entails a significant amount of manual drafting, photo-reduction steps, fabrication of photographic plates, and contact printing. Obviously, known artwork techniques have been extremely expensive and unreliable due to material costs and the criticality of the human endeavor involved, particularly, in the drafting and photo-reduction steps. Additionally, numerous inspection checks must be made during the fabrication of the mask, and also inspection of the printed circuit itself is necessary after it has been applied to the ceramic substrate. Thus the generation of artwork and the subsequent fabrication of masks, and the deposition of printed circuits on the ceramic substrate have created a problem area which requires close human attention, time, and expense.

Other means of forming a printed circuit pattern on a ceramic substrate, such as, the use of metal masks, photo-sensitive ink techniques, or a photoform process have been found to be equally disadvantageous for reasons as those discussed with regard to the use of known artwork techniques. For example, metal masks require expensive labor costs in the etching process, and also in the material costs involved. The photosensitive ink process, which involves direct exposure on a ceramic substrate coated with photosensitive ink, as opposed to direct exposure on a silk screen material, is considerably more expensive. Finally, the use of photoform process, that is etching via holes, is quite similar to the metal mask etching process and suffers from the same disadvantages. Accordingly, the concepts of the present invention have been described with regard to direct exposure and generation of screen masks, and a silk screen printing process.

It is therefore an object of this invention to automate the fabrication of multi-layer ceramic modules utilizing a silk screening process.

Another primary object of this invention is to directly expose photosensitized wire mesh mask screens or the like under computer control and inspection of the same.

A further object of this invention is to automate the fabrication of multi-layer ceramic modules which greatly reduce raw material costs by decreasing the turn around time of the overall operation, and which further provides a process which is readily adaptable to the reprocessing of wire mesh mask screens by stripping off obsolete printed circuit patterns, rejected printed circuit patterns, or low usage of printed circuit patterns.

Another object of the present invention is to automate the fabrication of modules which greatly improves output yield and allows for greater manufacturing tolerances in the making of multi-layer ceramic modules.

A still further object of the present invention is to provide for the automatic fabrication and inspection of wire mesh masks, and inspection of fabricated printed circuit patterns which have been deposited on a ceramic substrate.

SUMMARY OF INVENTION

The apparatus of the present invention automatically fabricates complex multi-layer ceramic modules which are employed to interconnect a plurality of integrated circuit chips, supply various voltage levels thereto, and provide input-output connections to other modules. Under computer control, the modules are automatically fabricated and inspected. To generate a printed circuit mask, calculated circuit data is stored in the control computer to automatically, directly expose a photosensitized wire mesh mask screen in all geometric areas conforming to the printed circuit pattern by utilizing a Printed Circuit Exposure Inspection Tool (PCEIT). The latent images formed on the wire mesh mask screen are then inspected in the PCEIT, followed by development of the latent images which have been properly formed. Another inspection is performed in the PCEIT after the development step. Ceramic green sheets or module layers are selectively punched and delivered to a silk screen print station at which time the acceptable developed masks are then placed in intimate contact with the green sheets for printing the desired conductive printed circuit pattern thereon. Next, the ceramic layers or substrates are inspected at the PCEIT in order to eliminate erroneously formed printed circuit patterns. Finally, the individual layers are selectively stacked, and then conveyed to a firing process to produce the multi-layer ceramic modules.

The foregoing and other objects, features and advantages of the invention will be apparent from the following more particular description of preferred embodiments of the invention as illustrated in the accompanying drawings.

GENERAL DESCRIPTION

Figure 1:
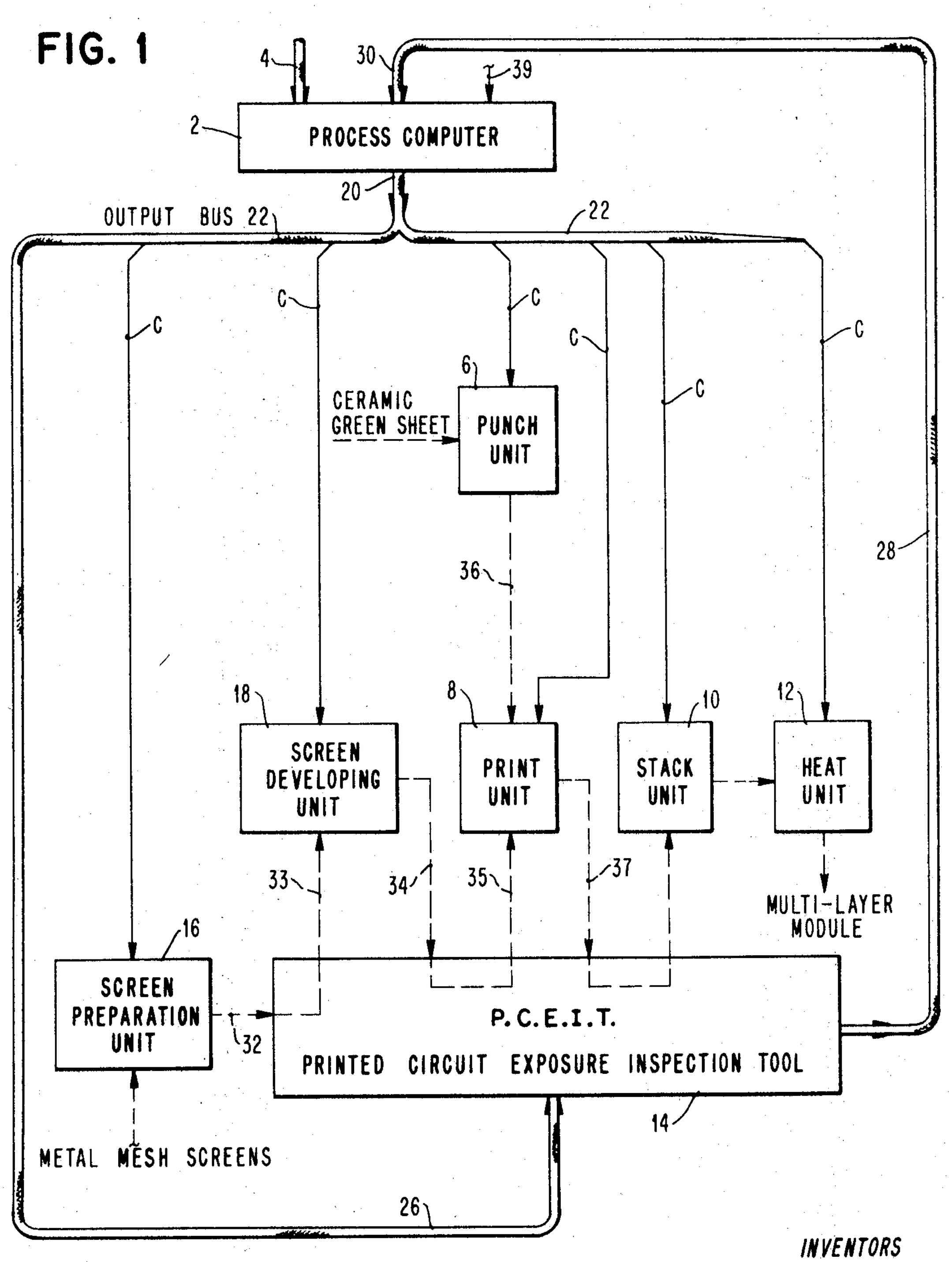
FIGURE 1 is a diagrammatic view of the automated apparatus for fabricating multi-layer ceramic modules, and includes a flow diagram of the raw materials utilized as well as the electrical interconnections to a process control computer.

Now referring to FIGURE , which discloses the broad concept of the automated apparatus for fabricating multi-layer ceramic modules under control of a process computer 2, input information to the computer 2 is provided by a magnetic tape, or an optically film, or a punch card unit designated as 4, and is utilized to control the operations of the various units, as hereinafter more fully described. The IBM 1800 Process Control Computer Series is one example of a process computer which has the capability of handling the control, logic, storage and monitoring functions illustrated in FIGURE 1. The input information on the input 4 may be read by conventional punch card readers, or optical readers, etc., for storage in the computer 2. In FIGURE 1, solid lines are used to indicate the various electrical interconnections between the apparatus units, while dashed lines are used to indicate the material flow, that is, the flow of the screen preparation and movement of the wire mask mesh screens, and the movement of the ceramic green sheet layers employed in the multi-layer ceramic module fabrication process. Firstly, in order to provide via holes in each ceramic green sheet, the sheet is selectively punched and inspected under automatic computer control at a Punch Unit 6. Next, each individual ceramic green sheet or substrate material processed at the Punch Unit 6 is deposited with a printed circuit conductive pattern at a Print Unit 8, selectively arranged at a Stack Unit 10, and fired at a Heat or Furnace Unit 12. The completed multi-layer module is then electrically tested (not shown) prior to ultimate utilization. A Printed Circuit Exposure Inspection Tool 14, as hereinafter more fully described with reference to FIGURES 2 and 3, automatically inspects each ceramic green sheet or substrate after deposition of a conductive printed circuit pattern at the print unit 8 in order to reject erroneously formed patterns.

Wire mesh masks are automatically generated or fabricated by preparing metal mesh screens at a Screen Preparation Unit 16, and includes coating each mesh screen with a photosensitized material, then exposing the mesh screen at the PCEIT tool 14 to form a latent image thereon, and developing the latent image at a Screen Developing Unit 18. The PCEIT tool 14 then automatically inspects each wire screen mask after exposure and development of the latent images under the supervision of the control computer 2. Properly formed printed circuit masks are then delivered to the Print Unit 8 where they are brought into contact with individual ceramic green sheets or substrates for the silk screening printing process, as previously described.

Each of the various operating units is controlled by the process computer 2 in accordance with conventional circuitry via a computer output control line 20 connected to an output bus 22, for example, as illustrated by a plurality of control lines C to each of the individual units. The control output bus 22 also delivers calculated data to the PCEI Tool 14 by way of a control line 26, while actual data measured by the PCEI Tool 14 connects to the computer 2 via an actual data line 28 and input data computer line 30. The PCEI Tool 14 receives a prepared or a mesh metal screen at the input indicated by dash line 32, and then automatically exposes and inspects the latent image before delivery to the screen developing unit 18 by way of a screen developing unit input line 33. Upon development of the latent printed circuit pattern image, the mask is returned to the PCEI Tool 14, as shown by line 34, at which time the developed image is again inspected. The ceramic green sheets or substrates and printed circuit masks are then delivered to the Print Unit 8 by way of its inputs 35 and 36 for silk screening print process. Finally, the conductive printed circuit pattern which has been deposited on a substrate is delivered to the PCEI Tool 14 by way of input 37 for a final inspection scan under supervision of the process computer 2.

GENERAL OPERATION

At the Punch Unit 6, ceramic green sheets are cleaned and then punched with via holes which provide electrical interconnections between various ceramic layers in the ultimately assembled multi-layer module. Prior to entry into the Screen Preparation Unit 16, metal mesh screens are mounted on frames, washed, dried (not shown), and then coated with an appropriate layer of photosensitive epoxy at Unit 16. If desired, fabricated masks, for example those which may have become obsolete or those which have not passed inspection, may be stripped of their epoxy material and recycled into the system at this point.

At the Screen Developing Unit 18, the wire mesh screens containing the latent images are developed, washed, and then dried. Processed ceramic green sheets and the fabricated masks are then united at the Print Unit 8 wherein a conductive printed circuit pattern is formed on the green sheet by conventional silk screening techniques. The ceramic green sheets each containing a printed circuit pattern thereon are then selectively stacked in the Stack Unit 10 and then fired in the Heat Unit 12 to form the multi-layer modules. During the process, the PCEI Tool 14 automatically forms the mask, and also inspects the mask and the conductive printed circuit formed on the substrate or green sheet.

DESCRIPTION OF THE PCEI TOOL

Figure 2:
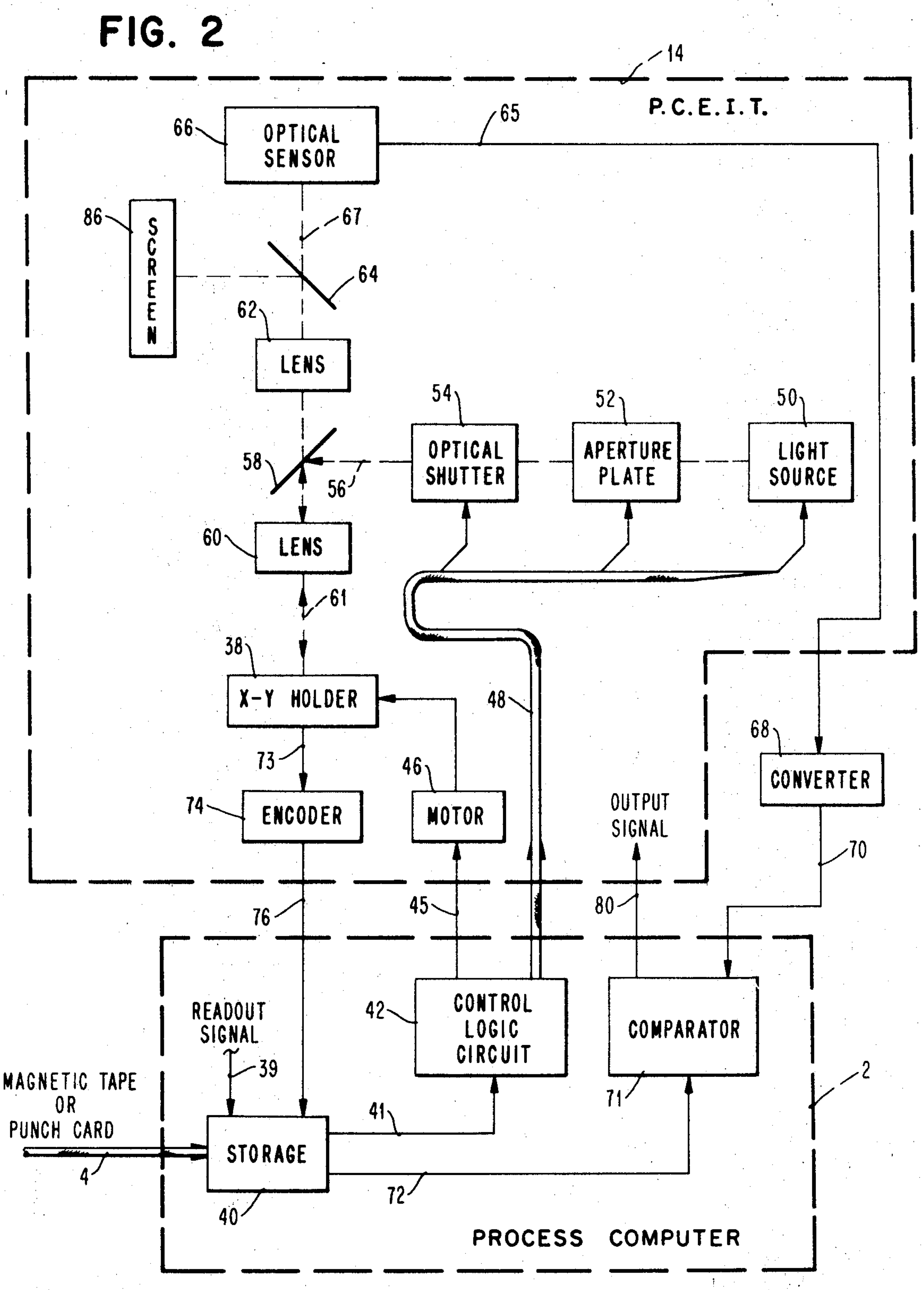
FIGURE 2 is a diagrammatic view of the printed circuit exposure and inspection tool.
Figure 3:
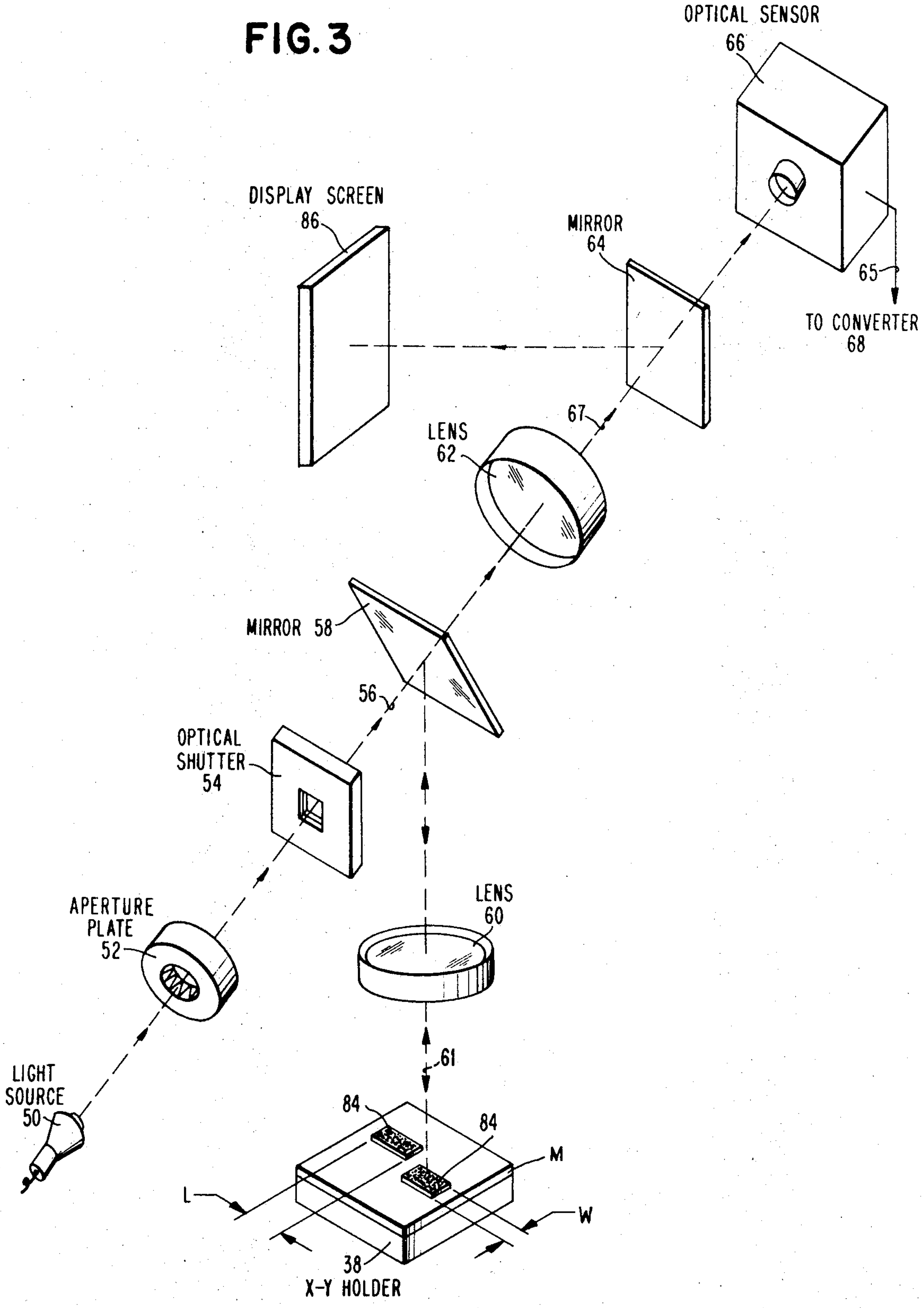
FIGURE 3 is a more detailed diagrammatic view of the optical elements employed in the printed circuit exposure and inspection tool illustrated in FIGURE 2 .

Now referring to FIGURES 2 and 3 which show in greater detail a preferred embodiment of the PCEI Tool utilized in the multi-layer apparatus. Since the PCEI Tool operates in one exposure and a plurality of inspection modes, the detailed description and operation of tool 14 is made in connection with the exposure or formation of a latent image and its inspection on a photosensitized wire mesh screen used to fabricate a mask. However, inspection of the developed latent image and of the deposited conductive printed circuit pattern is also similarly performed by the PCEI Tool 14.

In order to eliminate the conventional artwork techniques employing manual drafting, photoreduction, photographic plates, and contact printing an optical system controlled by the computer 2 automatically and directly exposes photosensitized wire mesh screens which are positioned on an X-Y holder 38 for movement in an X-Y plane. In response to a selected readout signal 39, calculated printed circuit data in a computer storage 40 connects by way of a line 41 to a control logic circuit 42 which provides a plurality of output control and timing functions in accordance with the particular type of calculated data being routed therethrough. Obviously, and more particularly since the computer per se does not constitute a part of this invention, control logic circuit 42 is merely a schematic representation of what may be actually a plurality of various circuit elements, depending on the particular process computer employed, and also on the particular programming scheme. Likewise, the readout line 39 connected to the computer storage is merely a schematic representation for illustrative purposes. Additionally, for purposes of clarity, specific timing signals and circuits have not been shown for the various computer elements; but it is to be understood that conventional computer timing circuits may be employed.

A control logic output signal on line 45 is generated in response to calculated data from line 41, and is applied to X-Y stepping motor 46 to control the movement of the X-Y holder 38. In synchronism with the movement of the X-Y holder 38, calculated data is read from the computer storage 40 to control the exposure of the photosensitized screen via the control logic circuit 42 and its associated control output line 48 in order to selectively operate a light source 50, aperture plate 52, an interrelated optical shutter 54. As designated by the dash line in FIGURE 2, a light beam 56 emanating from the shutter 54 impinges on a mirror 58, and is downwardly projected through a lens system 60 and a beam path 61 so as to ultimately illuminate or expose the photosensitized mesh screen.

In the inspection mode of operation, light impinging on the holder material or photosensitized screen is reflected upwardly along the beam path 61, through the lens system 60, the partial reflecting mirror 58, another lens and half reflecting mirror 62 and 64, respectively, and finally to an optical sensor 66 which converts the image intensity 67 to an electrical output signal on the line 65. The electrical output signal on the line 62, indicative of actual circuit data information, is connected to the input of a converter 68 which generates a digital output signal on line 70 that is applied to a comparator 71 within the computer 2. Also, calculated data from the computer storage 40 is applied to the comparator 71 by way of a comparator input line 72. The analog or actual position of the holder 38 is applied to an input line 73 of an encoder 74, which in response thereto, generates a digital output signal on a line 76 which in turn connects to the storage 40. In a similar manner to the readout line 39, line 76 controls the readout of calculated printed circuit data or information from the computer storage 40 for use in the comparison operation. An output signal 80 from the comparator 66 is generated in accordance with the comparison between the actual and calculated data, and thus determines whether a pattern has been properly formed.

OPERATION OF PCEI TOOL - EXPOSURE AND INSPECTION

Reference is made to FIGURE 2 and more particularly to FIGURE 3 for a description of the optical elements employed in the automatic exposure and inspection operation, and wherein like numerals are used to designate like elements as previously described with respect to FIGURES 1 and 2.

Under computer control, information previously stored in the computer storage 40 as calculated circuit data controls the movement of the mesh photosensitized screen M positioned on the X-Y table or holder 38 in a predetermined pattern relative to the optical system. Assume by way of a simplified illustration that it is desired to expose the photosensitized wire mesh screen material M with a geometric pattern as indicated by a plurality of elements 84. Calculated data from the computer generates control signals to line 48 to selectively position the aperture plate 52 to an aperture opening corresponding to the predetermined pattern width. In this instance, the apertured plate opening would coincide with a width W of the rectangles or patterns 84 to be exposed, as shown in the simplified illustrative version. As the holder 38 moves the material M through the predetermined X-Y scan, the shutter plate 54, also under control of the computer line 48, is maintained in a closed or non-radiating state, and accordingly the beam path 56 is off. The shutter 54 is automatically opened for a selected time period in accordance with the calculated data via the line 48, and takes into account such things as the longitudinal dimension L of the pattern elements 84 and the velocity of the holder 38. For example, the calculated data would be indicative of the coordinates starting and stopping locations of the patterns 84. Thus in one example, the photosensitized material M would be exposed in what is essentially a start and stop mode of operation. Similarly, any geometric pattern may be viewed as being made up of a plurality of fine dots. Each dot would then have a coordinate X-Y location which could be selectively exposed to generate the desired geometric pattern. Thus in the simplified illustration of FIGURE 3, the surface of photosensitized material M will be exposed at the selective areas 84 as the light beam is turned on and reflected downwardly from the mirror 58 and through the lens system 60 to form the exposure beam 61. To reiterate, accurate and efficient exposure is accomplished by direct illumination thus eliminating conventional artwork techniques. The partial reflecting mirror 58 functions to reflect light downwardly and thus form selective exposure beam 61, and also allows light to pass therethrough in an upward direction towards the lens system 62 in the inspection operation as will be described next. The inspection operation employs reflective techniques; although, it is within the scope of the disclosed embodiment to position the light source behind the X-Y holder 38 in a transmittal mode of operation inasmuch as the material is sufficiently translucent to pass light of varying intensities which could be indicative of exposed and nonexposed areas.

During inspection, the X-Y holder 38 moves in the same predetermined pattern as previously described in connection with the start-stop exposure mode of operation. Calculated data from the computer storage 40 by way of control logic 42 and output line 48 operatively condition the aperture plate 52 to provide an exposure or scan width identical to that described in the exposure of the photosensitized mesh screens used to form a latent image. In other words, the beam of light 56 is of an identical dimension and follows the same path in both the exposure and inspection operation. However, in the inspection operation the shutter 54 is maintained in a continuously open position by the control line 48. The beam of light 56 is reflected downwardly by the partial reflecting mirror 58 and the lens 60 so as to trace a predetermined path on the material M. Inasmuch as the unexposed and exposed photosensitized material possess different indices of reflection, predetermined light intensity is reflected upward through the optical system comprising lens 60, partial reflecting mirror 58, lens 62, and the partial reflecting mirror 64 to form the optical beam 67 indicative of actual or measured circuit data. The optical beam 67 is converted by the optical sensor 66 to an electrical signal and fed by way of the sensor output line 62 to the converter 68. This information is converted to digital information compatible with the computer 2 and stored in the comparator 66. This actual or measured circuit data is then compared with the calculated circuit data previously contained in the computer storage 40 and which is read out in accordance with the position of the X-Y holder 38. In this instance, the calculated data would take into consideration the physical dimensions of the printed circuit, the physical position of the printed circuit, the reflective qualities of the material being inspected, etc. The comparison signal generated at the output line 80 would provide a control signal for automatically rejecting photosensitized screens in which latent images have been improperly formed or exposed.

The reflection inspection techniques are similarly utilized to inspect the photosensitized mesh screens which have been developed in the Screen Developing Unit 18, and also the conductive printed circuit patterns which have been printed at the Print Unit 8 on the ceramic green sheets or substrate layers, as illustrated by the input lines 34 and 37 to the PCEI Tool 14. During these inspection operation, the calculated data utilized in making the comparison with the measured or actual circuit data would take into consideration the fact that light is being reflected from a surface which has a different index of reflection as well as other variables that may be involved. Finally, as illustrated in FIGURE 2 an image of the surface being inspected may be reflected from the mirror 54 to a screen 86 to provide a visual display of the inspection modes of operation.

Although preferred embodiments have been illustrated and described in connection with the generation of control signals via a digital process computer 2 having analog capabilities, it is to be understood that only analog control signals could be similarly employed. For example, in the exposure and inspection of a photosensitized screen analog signals may may be used to control the movement of the holder 38 as well as the positioning of the optical elements, for example, the aperture plate 52 and the shutter 54.

DESCRIPTION OF PUNCH UNIT

Figure 4:
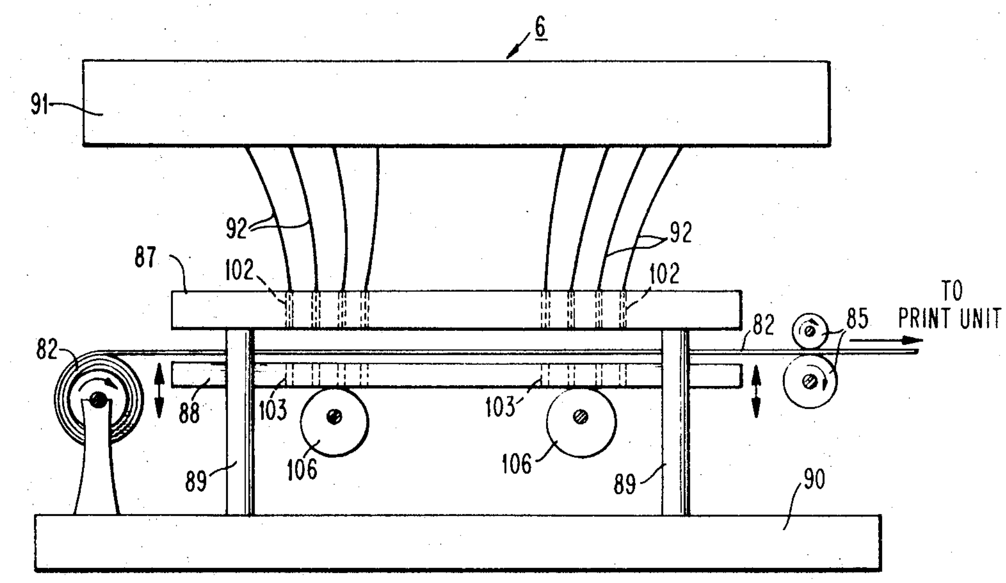
FIGURE 4 is a diagrammatic view illustrating one arrangement which could be employed for the Punch Unit shown in FIGURE 1 and which is used to punch ceramic green sheet material.
Figure 5:
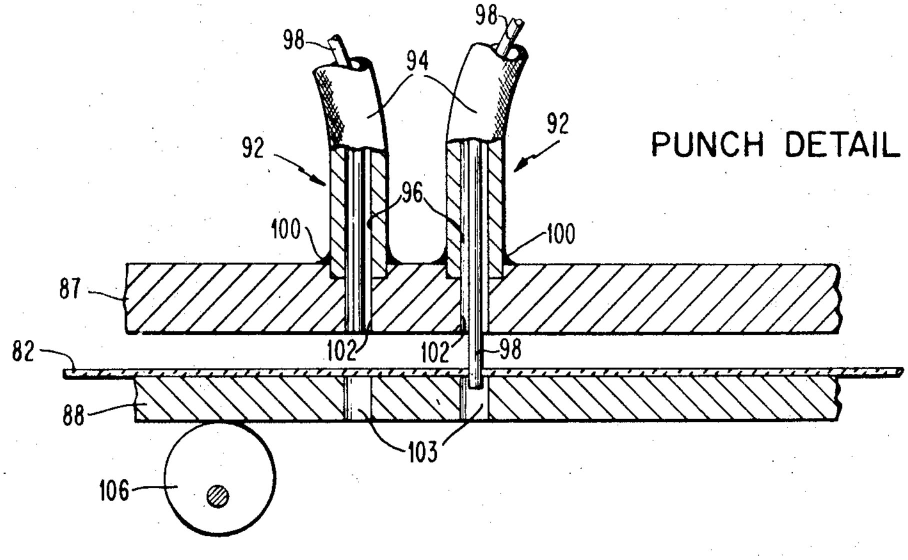
FIGURE 5 is a detailed cross-sectional view taken along lines 44 of FIGURE 4 to illustrate the punching of a green sheet.

Now referring to FIGURES 4 and 5 which show the Punch Unit 6 in greater detail. In order to provide via holes in the ceramic green sheet material, a preselected portion of the green sheet material from a roll of material 82 is positioned between a pair of rollers 85, between a fixed platform 86 and a platform 88 which platform 88 is slideably movable on vertical shafts 89, and supported by a base 90. A control unit 91 contains solenoid relays (not shown) which are energized in accordance with information stored in the computer 2 so as to activate a flexible cable punch unit shown schematically as elements 92, and which essentially comprise an outer flexible cable casing 94 similar to a speedometer cable, and a punch rod 98, and which punch units 92 are positioned by attaching means, such as well points 100, with respect to a plurality of holes or bores 102 formed in the fixed platform 86. Suitably formed holes 103 in the movable or driven platform 86 are formed so as to axially align with the punch rods 98. Selected punch units 92 are activated under control of the computer 2 so as to move a punch rod 98 into a down position (as illustrated in the right-hand portion of FIGURE 5) so that the ceramic green sheet material 82 will be pierced or punched upon actuation of an eccentric roller, designated 106. In this manner of operation, the punch units 92 may be preselected prior to the sheet material entering the punch area since the movable platform 88 which supports the sheet material 82 is eventually raised to engage the activated punch rods 98.

DESCRIPTION OF PRINT UNIT

Figures 6, 7:
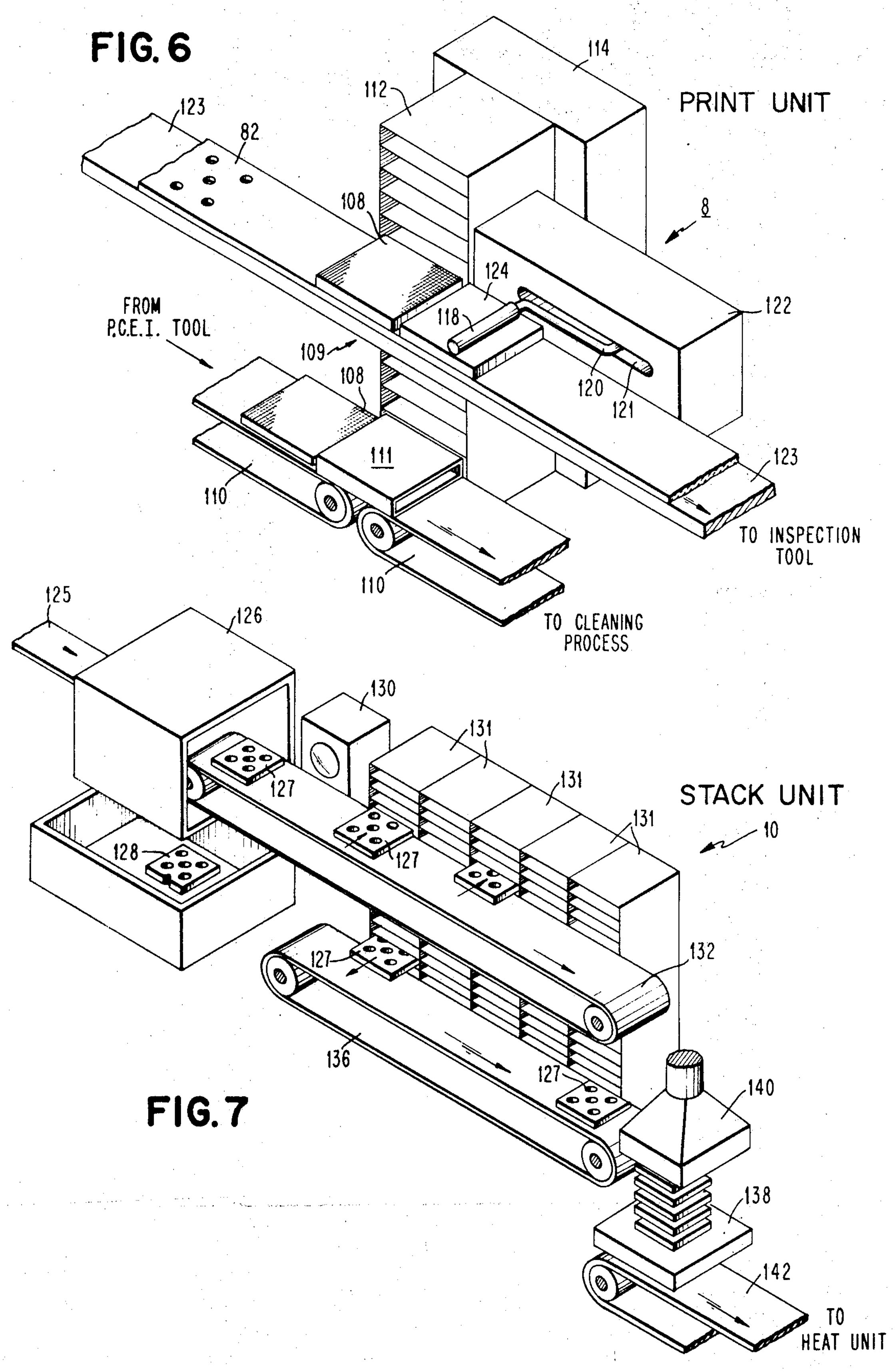
FIGURE 6 is a diagrammatic view of the Print Unit shown in FIGURE 1 , and illustrates how a punched ceramic green sheet may be joined with a mask screen for printing a conductive pattern on the punched green sheet or substrate.
FIGURE 7 is a diagrammatic view showing one arrangement which could be employed for the Stacking Unit of FIGURE 1 .

Now referring to FIGURE 6 which diagrammatically depicts one arrangement which may be utilized to deposit a conductive printed circuit pattern on a ceramic green sheet material which has been previously punched. In order to deposit a printed conductive circuit pattern on a ceramic green sheet shown at 82, a preselected screen 108 which has been previously exposed and inspected is appropriately positioned over the green sheet 82 in work area 109 in response to information stored in the control computer 2. A transfer belt arrangement 110 delivers a plurality of screens 108 from the PCEI Tool to a loading and unloading unit 111 for entry into a screen store container 112 which is capable of storing a plurality of screens 108. A screen select mechanism 114 operates under computer control to position the desired screen and eject the same into the work area 109. The screen select mechanism has not been shown in detail; however, it is readily apparent that it could take various forms within the scope of the present invention. For example, storage screens 108 in the container 112 could be placed on revolving trays and appropriately indexed to the work area 109 under control of the screen select mechanism 114.

A conductive fluid application roller 118 mounted on an affect shaft 120 is slideably movable in guiding slot 121 and connects to a roller drive mechanism 122. A conductive fluid container indicated at 124 is fixedly mounted to the front surface of the roller drive mechanism 122 in such a position that the roller 118 will be rolled across it and thus provide conductive liquid material which will eventually be deposited on the ceramic green sheet material 82.

In operation, the screen select mechanism 114 will eject a predetermined screen from the screen container 112 and place it upon a punched green sheet 82 which has been positioned on a movable platform 123, and which itself is mounted on rollers (not shown) and is operative when actuated to pull the green sheet 82 beneath the application roller 118. During the printing operation the green sheet 82 and mask screen 108 are stationary so that the roller drive mechanism 122 in conjunction with the guide slot 121 will cause roller 118 to be rolled across the fluid container and then across the screen 108 so that a conductive circuit pattern is appropriately deposited on the ceramic substrate green sheet. With the printing operation completed, the screen 108 will be lifted from the ceramic green sheet 106, and then the sheet 106 will be pulled to the right in response to the movement of the movable platform 123.

During this printing operation, appropriate coded marks are deposited on the ceramic green sheet material 82 in addition to the actual circuit pattern. These coded marks will be optically sensed in a later stacking operation, as hereinafter more fully explained.

DESCRIPTION OF STACK UNIT

Now referring to FIGURE 7 which diagrammatically shows in greater detail the Stack Unit 10 of FIGURE 1. The printed, punched, and coded green sheet material 125 is fed to the Stack Unit 10 after having been inspected at the PCEI Tool. Next, a cutting unit 126 severs the sheet material 125 into appropriate individual ceramic green sheet lengths 127. Additionally, incorrectly formed layers or patterns as previously determined by PCEI Tool, which for example would be appropriately marked at the inspection station by notching, may be sensed optically (not shown) and ejected as scrap material, as indicated at 128. An optical sensor 130 is responsive to the coded data or marks previously deposited at the printing operation so as to divert the individual layers or sheets to appropriate containers 131 by way of a transfer belt 132. Although the specific means for diverting the layers to the appropriate containers 131 has not be shown, it is appreciated that many structural implementations are available to perform this function and do not form part of this invention. For example, mechanical arm means or appropriately placed air supplies could be employed to divert the layers into the proper containers.

Once the cut, printed, and punched ceramic green sheets 127 are diverted to the appropriate containers 131 they will descend towards a stacking position in the bottom of the containers 131.

In accordance with the particular type of multi-layer ceramic module being formed, the individual layers 127 will be selectively removed from the containers under computer control and delivered to a transfer belt 136 in the proper sequence. From the transfer belt 136, the layers 127 will then be delivered into a stacked arrangement on an X-Y table 138 in the proper order. A pressing ram 140 will then be actuated to compress the individual layers together. The multi-layer module will then be delivered to a transfer belt 142 for delivery to a heating unit. The press or ram unit 140 may contain optical sensors, which for example could be employed to read alignment holes in the individual layers, and thus generate an error signal when the layers have not properly been stacked on the X-Y table.

DESCRIPTION OF HEAT UNIT

Figure 8:
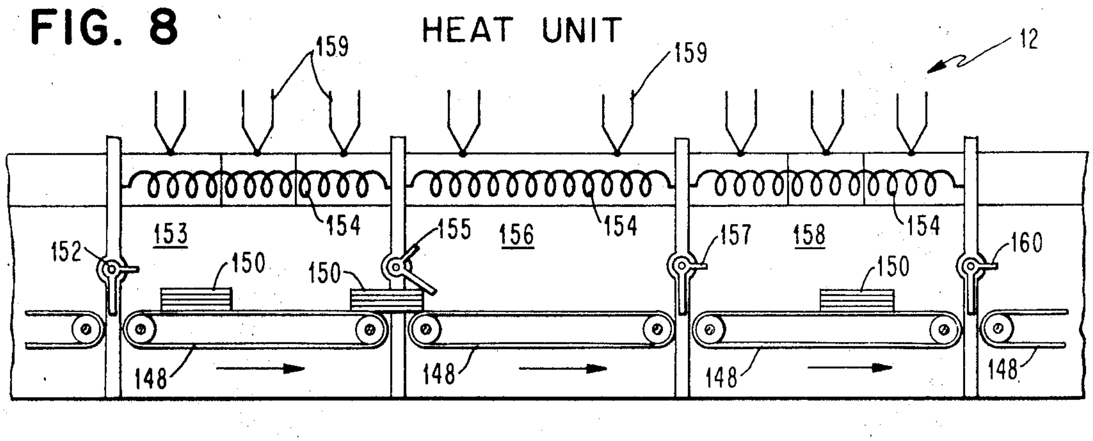
FIGURE 8 is a diagrammatic view of one arrangement which could be employed for the Heating Unit shown in FIGURE 1.

Now referring to FIGURE 8 which shows the Heat Unit 12 of FIGURE 1 in greater detail. A plurality of transfer belts 148 move a plurality of multi-layer ceramic modules 150 through an entrance gate 152 into a first oven zone 153 which is preconditioned by heating coils 154 to provide the desired profile. Next, the multi-layer ceramic modules travel through gate 155 to a constant temperature ceramic firing zone 156, and then through gate 157 to a cooling zone 158. The plurality of heating coils 154 in each of the zones and a plurality of thermal couple scanners 159 are readily controlled to satisfy the necessary operating conditions under monitoring of the control process computer 2. The modules finally exit at gate 160.

DESCRIPTION OF SCREEN PREPARATION UNIT

Figure 9:
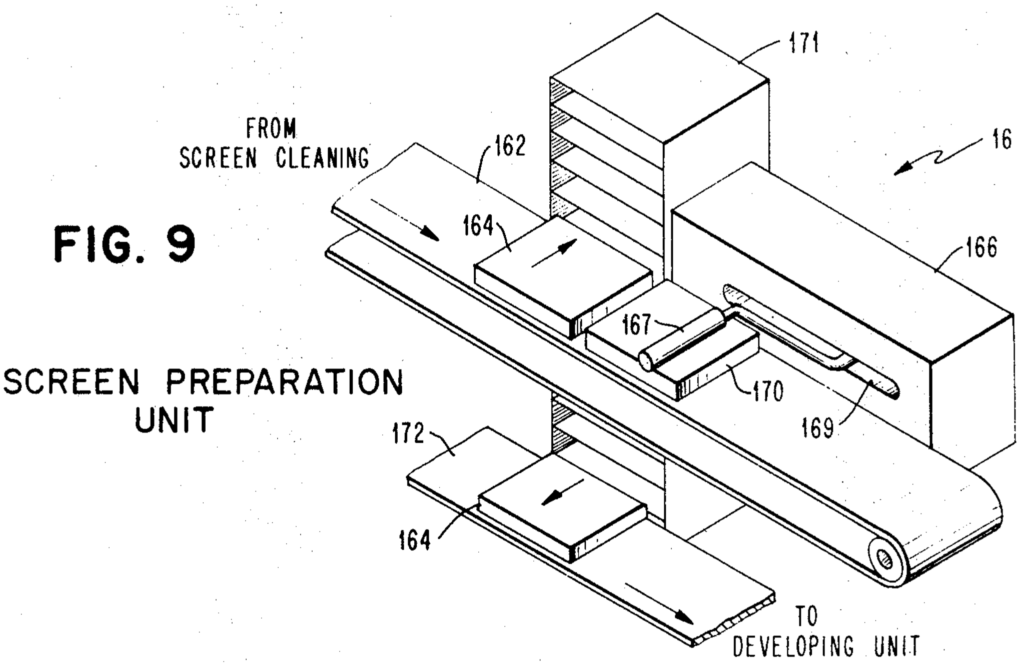
FIGURE 9 shows the Screen Preparation Unit shown in FIGURE 1 and illustrates diagrammatically one means which could be employed to apply photosensitive material to the screens.

Now referring to FIGURE 9 which shows in greater detail one embodiment of a screen preparation unit which could be employed for the Screen Preparation Unit 16 of FIGURE 1. The unit comprises a transfer belt 162 which delivers screen material, indicated generally at 164 to a roll driver assembly 166 which moves an application roller 167 along a longitudinal slot 169. A photosensitive epoxy material from container 170 is rigidly attached in a horizontal plane and an appropriate distance above the transfer belt 162 and below the bottom of the roller 167. The roller 167 is driven by driver assembly 166 to first pick up the epoxy material and then deposit the material onto the screen. The coated screen may then be moved to the Developing Unit via a transfer unit 171 and a conveyor 172.

DESCRIPTION OF SCREEN DEVELOPING UNIT

Figure 10:
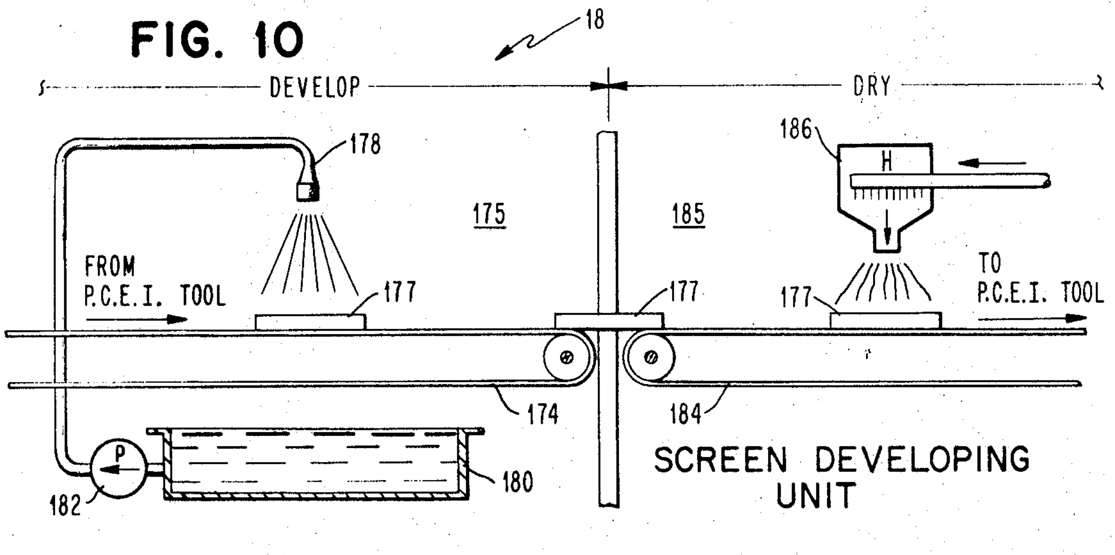
FIGURE 10 is a diagrammatic view of the Screen Developing Unit shown in FIGURE 1, and illustrates one arrangement which could be used to develop exposed photosensitized screens.

Now referring to FIGURE 10 which shows in greater detail the Screen Developing Unit 18 of FIGURE 1. After a photosensitized screen has been examined by the PCEI Tool it is delivered by a transfer belt 174 into a develop area 175 which carries the screen shown as 177 under a spray nozzle 178 which sprays it with cleaning fluid so as to remove the unexposed epoxy areas. The fluid is caught in a container 180 and recycled into the system by operation of a pump 182. Another transfer belt 184 carries the developed screen into the dry area 185 and under a forced hot air shower indicated at 186 in order to dry it prior to being transferred to the PCEI Tool by transfer belt 184 for another inspection operation.

Although the PCEI Tool has been shown and described in the multi-layer ceramic module process embodiment, it is readily apparent that it may be employed in exposing and/or inspecting single layers.

While the invention has been particularly shown and described with reference to preferred embodiments thereof, it will be understood by those skilled in the art that various changes in form and details may be made therein without departing from the spirit and scope of the invention.

We claim:

1. An apparatus for forming circuit masks and comprising:

(a) a computer control means having calculated circuit data signals entered therein indicative of a circuit pattern;

(b) said computer control means having an output for providing control signals in accordance with said calculated data;

(c) a supply of photosensitized material;

(d) an exposure means for receiving said photosensitized material;

(e) said exposure means being connected to said control signals for forming circuit patterns on said sensitized material in accordance with said calculated data;

(f) said exposure means further including a holder for receiving said photosensitized material;

(g) a light source for illuminating said photosensitized material;

(h) means for selectively interrupting said light source;

(i) said means for interrupting said light source and said holder being selectively connected to said control signals;

(j) said holder and said light source movable relative to each other in response to said control signals for forming patterns on said received photosensitized material;

(k) inspecting means for checking said patterns formed by said exposure means;

(l) said inspecting means further including an optical sensing means for generating actual circuit data signals indicative of said pattern formed by said exposure means;

(m) said computer control means being connected to said actual circuit data; and (n) said computer control means being responsive to said actual and calculated data for generating error signals for indicating incorrectly formed patterns.

2. An apparatus for forming circuit masks as in Claim 1 further including:

(a) means to develop said photosensitized material for forming a printed circuit mask;

(b) a substrate processing unit for providing substrates; and (c) a print unit means adapted to receive said printed circuit masks and substrates for printing conductive circuit patterns on said substrates.

3. An apparatus for forming circuit masks as in Claim 2 wherein:

(a) said holder is adapted to receive said substrates having conductive circuit patterns thereon;

(b) said optical sensing means being operative to generate actual circuit data signals indicative of said conductive circuit patterns; and (c) said computer control means being responsive to said actual circuit data indicative of conductive circuit patterns and responsive to said calculated circuit data for generating error signals of incorrectly formed conductive circuit patterns.

4. An apparatus for forming circuit masks as in Claim 3 and further including:

(a) means for stacking said substrates having patterns thereon to form a module; and (b) means for heating said module so as to form a multilayer ceramic module.